(12) United States Patent
Basker et al.

(10) Patent No.: US 8,507,187 B2
(45) Date of Patent: Aug. 13, 2013

(54) MULTI-EXPOSURE LITHOGRAPHY EMPLOYING A SINGLE ANTI-REFLECTIVE COATING LAYER

(75) Inventors: Veeraraghavan S. Basker, Schenectady, NY (US); Willard E. Conley, Schenectady, NY (US); Steven J. Holmes, Guilderland, NY (US); David V. Horak, Essex Junction, VT (US)

(73) Assignees: International Business Machines Corporation, Armonk, NY (US); Freescale Semiconductor, Inc., Austin, TX (US)

( * ) Notice: Subject to any disclaimer, the term of this patent is extended or adjusted under 35 U.S.C. 154(b) by 1425 days.

(21) Appl. No.: 12/169,888

(22) Filed: Jul. 9, 2008

(65) Prior Publication Data

US 2010/0009131 A1 Jan. 14, 2010

(51) Int. Cl.
*G03F 7/20* (2006.01)
(52) U.S. Cl.
CPC .................................. *G03F 7/20* (2013.01)
USPC ........... 430/317; 430/311; 430/312; 430/322; 430/394
(58) Field of Classification Search
CPC ........................................................ G03F 7/20
USPC ................. 430/311, 312, 307, 322, 394, 317
See application file for complete search history.

(56) References Cited

U.S. PATENT DOCUMENTS

| | | | | |
|---|---|---|---|---|
| 5,733,712 | A * | 3/1998 | Tanaka et al. | 430/314 |
| 5,858,621 | A * | 1/1999 | Yu et al. | 430/313 |
| 6,627,387 | B2 * | 9/2003 | Hsieh et al. | 430/313 |
| 6,853,043 | B2 * | 2/2005 | Yeh et al. | 257/437 |
| 7,749,680 | B2 * | 7/2010 | Jung et al. | 430/270.1 |
| 7,781,149 | B2 * | 8/2010 | Paxton et al. | 430/311 |
| 7,862,986 | B2 * | 1/2011 | Yang | 430/313 |
| 7,883,829 | B2 * | 2/2011 | Holmes et al. | 430/270.1 |
| 2003/0039922 | A1 * | 2/2003 | Han et al. | 430/312 |
| 2004/0087139 | A1 * | 5/2004 | Yeh et al. | 438/636 |

* cited by examiner

*Primary Examiner* — John Chu
(74) *Attorney, Agent, or Firm* — Scully, Scott, Murphy & Presser, P.C.; Yuanmin Cai

(57) ABSTRACT

A first photoresist is applied over an optically dense layer and lithographically patterned to form an array of first photoresist portions having a pitch near twice a minimum feature size. The pattern in the first photoresist portions, or a first pattern, is transferred into the ARC layer and partly into the optically dense layer. A second photoresist is applied and patterned into another array having a pitch near twice the minimum feature size and interlaced with the first pattern. The pattern in the second photoresist, or a second pattern, is transferred through the ARC portions and partly into the optically dense layer. The ARC portions are patterned with a composite pattern including the first pattern and the second pattern. The composite pattern is transferred through the optically dense layer and into the underlayer to form a sublithographic pattern in the underlayer.

16 Claims, 10 Drawing Sheets form the lithographic pattern. The minimum feature size F that a projection system can print is given approximately by:

$$F = k \times \lambda / N_A,$$

where k is a coefficient that reflects tool specific proportionality constant reflecting the efficiency of the lithography system and other process related factors, $\lambda$ is the wavelength of the light employed for radiation, and $N_A$ is the numerical aperture of the lens. Typically, the value of the coefficient k is in the range of about 0.5.

MULTI-EXPOSURE LITHOGRAPHY EMPLOYING A SINGLE ANTI-REFLECTIVE COATING LAYER

FIELD OF THE INVENTION

The present invention relates to semiconductor processing methods, and particularly to methods for multi-exposure lithography employing a single anti-reflective coating (ARC) layer, and structures for effecting the same.

BACKGROUND OF THE INVENTION

Lithography is employed in semiconductor manufacturing to pattern features in a photoresist. A layer of photoresist is exposed to incident light, which may be deep-ultraviolet (DUV) radiation, mid-ultraviolet (MUV) radiation, or X-ray radiation. Alternately, the layer of photoresist may be exposed to energetic electron in e-beam lithography. The energy of the photons or electrons causes changes in chemical composition of exposed portions of the photoresist, for example, by cross-linkage, scission, side chain removal, etc. Pre-baking or post-baking of the photoresist may be employed to maximize the changes in the chemical properties of the exposed portion of the photoresist relative to unexposed portions of the photoresist.

The exposed photoresist is developed to remove one of the set of exposed portions of the photoresist and the set of unexposed portions of the photoresist relative to the other. The photoresist is classified as a positive photoresist or a negative photoresist depending on the nature of the chemical changes upon exposure. If the photoresist becomes chemically less stable upon exposure, the photoresist is a positive photoresist. If the photoresist becomes chemically more stable upon exposure, the photoresist is a negative photoresist. In case a positive photoresist is employed, the exposed portions of the positive photoresist are removed upon development. In case a negative photoresist is employed, the unexposed portions of the negative photoresist are removed upon development.

A developed photoresist comprises a lithographic pattern. The features of the lithographic pattern have dimensions that are the same as, or greater than, a "minimum feature size," which is also called a "critical dimension." The minimum feature size is a function of a lithography tool employed to form the lithographic pattern. The minimum feature size F that a projection system can print is given approximately by:

While the minimum feature size is defined only in relation to a lithography tool and normally changes from generation to generation of semiconductor technology, it is understood that the minimum feature size, i.e., the critical dimension, is to be defined in relation to the best performance of lithography tools available at the time of semiconductor manufacturing. As of 2008, the minimum feature size is about 50 nm and is expected to shrink in the future. Any dimension less than the lithographic minimum dimension is called a "sublithographic dimension."

While developments are under way to provide high numerical aperture exposure systems and/or increase the coefficient k to minimum feature size F, the rate of reduction of the minimum feature size F through such efforts is far slower than the rate of reduction of desired feature sizes for high performance of semiconductor devices. Further, obtaining light sources that provide reduced wavelength in the deep ultraviolet (DUV) or extreme ultraviolet (EUV) range turns out to be a difficult challenge. An adequate light source to enable printing of dimensions less than 50 nm is not commercially available.

The pattern in the developed photoresist is subsequently transferred into an underlying layer employing the developed photoresist and an etch mask. Thus, the dimensions of features that may be formed in a semiconductor structure are directly tied to the dimensions of features in the developed photoresist. The minimum pitch of a repetitive lithographic pattern is the twice the minimum feature size since each unit pattern includes a line and a space or a via hole and a surrounding spacer.

Prior art lithographic methods thus face a fundamental limitation in the feature sizes of a lithographic pattern, which is determined by the wavelength of a lithographic system employed.

In view of the above, there exists a need to provide methods of forming sublithographic features, i.e., features having dimensions less than the minimum feature size of a lithographic system.

SUMMARY OF THE INVENTION

The present invention addresses the needs described above by providing methods of forming a composite pattern from multiple exposures in an anti-reflective coating (ARC) layer.

In the present invention, an optically dense layer is formed over an underlayer. A first photoresist is applied over the optically dense layer and lithographically patterned to form an array of first photoresist portions having a pitch near twice a minimum feature size. The pattern in the first photoresist portions, or a first pattern, is transferred into the ARC layer and partly into the optically dense layer. After removal of the first photoresist, an adhesion promoter and a second photoresist are applied over ARC portions. The second photoresist is patterned into another array having a pitch near twice the minimum feature size and interlaced with the pattern of the ARC portions. The pattern in the second photoresist, or a second pattern, is transferred through the ARC portions and partly into the optically dense layer. The ARC portions are patterned with a composite pattern including the first pattern and the second pattern. The composite pattern having a sublithographic pitch is transferred through the optically dense layer and into the underlayer to form a sublithographic pattern in the underlayer.

According to an aspect of the present invention, a method of forming a patterned structure is provided, which comprises:

forming, from bottom to top, an optically dense layer, an anti-reflective coating (ARC) layer, and a first photoresist on a substrate;

lithographically patterning the first photoresist with a first pattern and transferring the first pattern into the ARC layer by a first etch;

applying a second photoresist on the optically dense layer and the ARC layer;

lithographically patterning the second photoresist with a second pattern and transferring the second pattern into the ARC layer by a second etch; and transferring a composite pattern of the first pattern and the second pattern into an underlying layer on the substrate.

In one embodiment, the optically dense layer is formed directly on the underlying layer.

In another embodiment, the first pattern is a pattern of a periodic array having a lithographic pitch.

In even another embodiment, the composite pattern is a pattern of lines and spaces or a pattern of via holes.

In still another embodiment, the first photoresist is removed prior to applying the second photoresist.

In still yet another embodiment, the method further comprises transferring the first pattern partially into the optically dense layer by the first etch, wherein the first photoresist is completely consumed by the first etch.

In a further embodiment, the ARC layer contains the composite pattern after the second etch, and wherein sidewalls of the ARC layer are tapered.

According to another aspect of the present invention, a structure is provided, which comprises:

an optically dense layer located on a substrate;

an anti-reflective coating (ARC) layer located directly on the optically dense layer and having a first pattern of a periodic array having a lithographic pitch; and ca photoresist located on the ARC layer and having a second pattern of another periodic array having the lithographic pitch.

In one embodiment, the second pattern and the first pattern are offset from each other by one half of the lithographic pitch.

In another embodiment, the first pattern and the second pattern are patterns of lines and spaces or patterns of via holes.

In yet another embodiment, the optically dense layer has a periodic array of depressions from a top surface of the optically dense layer, wherein sidewalls of the a periodic array of depressions are vertically coincident with sidewalls of the first pattern in the anti-reflective coating (ARC) layer.

In still another embodiment, the structure further comprises an adhesion promoter layer abutting a top surface of the ARC layer and a bottom surface of the photoresist.

BRIEF DESCRIPTION OF THE DRAWINGS

FIG. 1 corresponds to a step after formation of an optically dense layer 70, an anti-reflective coating (ARC) layer 80L, and a first photoresist layer 82L.

FIG. 2 corresponds to a step after lithographic patterning of the first photoresist layer 82L to form first photoresist portions 82 having a first pattern.

FIG. 3 corresponds to a step after transfer of the first pattern into the ARC layer 80L to form ARC portions 80.

FIG. 4 corresponds to a step after removal of the first photoresist portions 82 by a first etch that transfers the first pattern partially into the optically dense layer 70.

FIG. 5 corresponds to a step after application of an adhesion promoter layer 88.

FIG. 6 corresponds to a step after application of a second photoresist layer 90L.

FIG. 7 corresponds to a step after patterning of the second photoresist layer 90L to form second photoresist portions 90 having a second pattern.

FIG. 8 corresponds to a step after transfer of the second pattern into the ARC portions 80, whereby the ARC portions have a composite pattern of the first pattern and the second pattern.

FIG. 9 corresponds to a step after removal of the second photoresist portions 90 by a second etch that transfers the second pattern partially into the optically dense layer 70.

FIG. 10 corresponds to a step after transfer of the composite pattern through the optically dense layer 70 into an underlying layer 66.

DETAILED DESCRIPTION OF THE INVENTION

Figure 1:
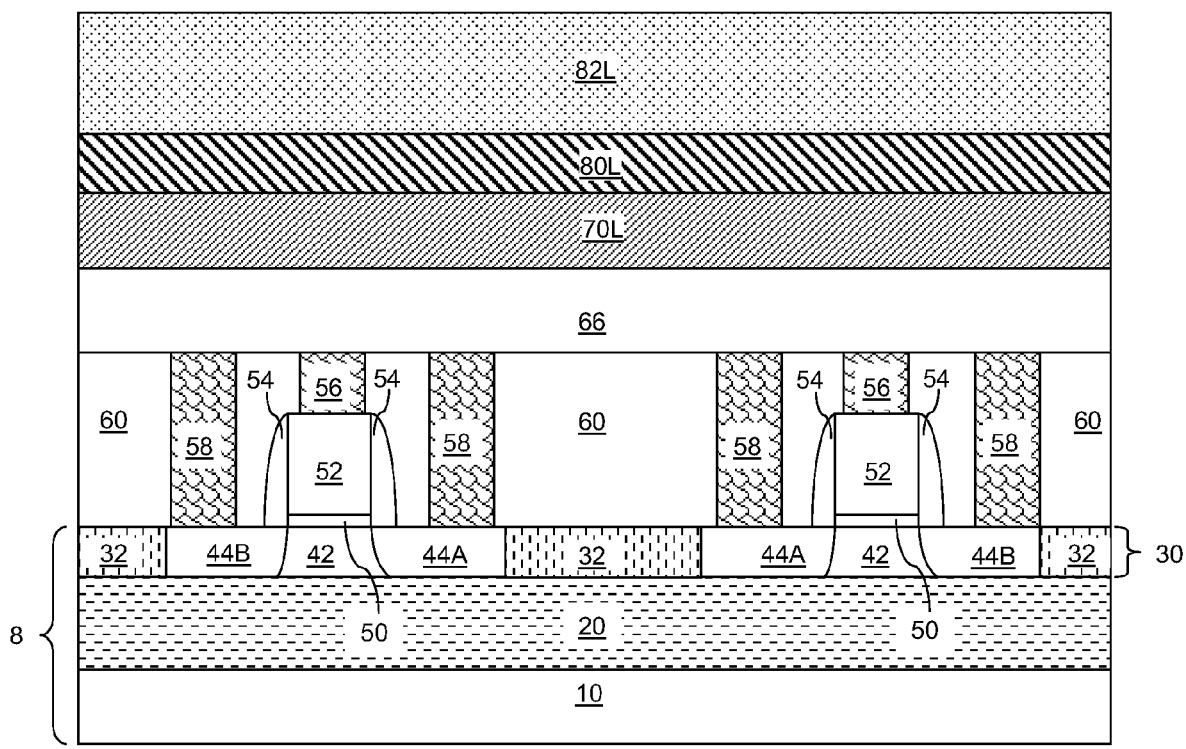
FIGS. 1-10 are sequential vertical cross-sections of an exemplary structure according to the present invention.

As stated above, the present invention relates to methods for multi-exposure lithography employing a single anti-reflective coating (ARC) layer and structures for effecting the same, which are now described in detail with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIG. 1, a first exemplary lithographic structure according to a first embodiment of the present invention comprises a semiconductor structure including a semiconductor substrate 8, semiconductor device structures, an underlayer 66, an optically dense layer 70L, and an anti-reflective coating layer 80L, and a first photoresist layer 82L. The semiconductor substrate 8 and the semiconductor device structure beneath the underlayer 66 are shown only for the purposes of illustration. In general, the present invention may be employed on any substrate on which, or in which, an underlayer is formed.

The semiconductor substrate 8 may be a semiconductor-on-insulator (SOI) substrate, which comprises a handle substrate 10, a buried insulator layer 20, and a top semiconductor layer 30. Alternately, the semiconductor substrate 8 may be a bulk substrate or a hybrid substrate having a bulk portion and a semiconductor-on-insulator portion. Semiconductor devices, which may be field effect transistors or any other semiconductor devices, may be formed in, or on, the semiconductor substrate 8. FIG. 1 shows two field effect transistors, each having a body region 42, a source region 44A, a drain region 44B, a gate dielectric 50, a gate electrode 52, and a gate spacer 54. At least one dielectric layer 60 may be formed over the semiconductor devices. Gate contact vias 56 and source and drain contact vias 58 may be formed on the gate electrodes 52 and source and drain regions (44A, 44B), respectively.

While the present invention is described with an underlying layer 66 located in a back-end-of-line (BEOL) structure, embodiments in which the underlying layer is located in a front-end-of-line (FEOL) structure or within a substrate are explicitly contemplated herein.

The underlying layer 66 may comprise a dielectric layer, a semiconductor layer, a conductive layer, or a stack thereof. In general, the underlying layer 66 may comprise any material that may be patterned employing an etch.

The optically dense layer 70L is formed on the underlayer 66. Optical density is the degree of opacity of a translucent medium expressed by $\log I_0/I$, where $I_0$ is the intensity of the incident ray, and I is the intensity of the transmitted ray. The optically dense layer 70L has a high optical density, i.e., the intensity of the transmitted ray is significantly less than the intensity of the incident ray. While the measure of significance of reduction of the intensity of the transmitted ray relative to the intensity of the incident ray depends on the purposes of the application for the optically dense layer 70L, for the purposes of the present invention, the optically dense layer 70L provides reduction of the intensity of the transmitted ray to a level that is consistent with lithographic applications, i.e., the patterning of a photoresist layer 80 without undue influence of any optical properties of the underlying layer 66. Typically, the optically dense layer 70L is considered to be sufficiently optically dense for lithographic purposes if the optical density exceeds log 10, i.e., if the intensity of the transmitted ray is less than 10% of the intensity of the incident light.

Typically, the optically dense layer 70L is a hydrocarbon material layer, and may comprise an anti-reflective coating material used in the art. The optically dense layer 70L may comprise a hydrocarbon-based polymer. The thickness of the optically dense layer 70L may be from about 50 nm to about 600 nm, and typically from about 100 nm to about 300 nm, although lesser and greater thicknesses are explicitly contemplated herein also.

The ARC layer 80L comprises an anti-reflective material. The ARC layer 80L comprises a hydrocarbon based material having a different material composition than the first photoresist layer 82L. In one embodiment, the ARC layer 80L comprises silicon at an atomic concentration from about 1% to about 50%, and typically from about 15% to about 43%. In another embodiment, the ARC layer 80L comprises a refractory metal at an atomic concentration from about 1% to about 50%, and typically from about 8% to about 45%. The ARC layer 80L controls reflectivity of the surface over which the first photoresist layer 82L is patterned by reducing standing waves and optical notching. The thickness of the ARC layer 80L may be from about 15 nm to about 300 nm, and typically from about 30 nm to about 150 nm, although lesser and greater thicknesses are explicitly contemplated herein.

The first photoresist layer 82L comprises an optically sensitive material. In one case, the first photoresist layer 82L comprises a deep-ultraviolet (DUV) sensitive photoresist material. For example, the photoresist layer 82L may include polyhydroxystyrene-based polymers containing a photoacid generator, which changes the solubility to a developer solution upon exposure to deep ultra-violet (DUV) light. Typically, the first photoresist layer 82L does not comprise fluorine. In case the first photoresist layer 82L comprises any fluorine, the fluorine content is at an insignificant level that does not affect the property of the first photoresist layer 82L in a significant manner. The fluorine content in the photoresist layer 82L in this case is less than 0.5% in atomic concentration. Alternately, the first photoresist layer 82L may comprise a mid-ultraviolet (MUV) photoresist, an extreme ultraviolet (EUV) photoresist, or an X-ray photoresist.

The thickness of the first photoresist layer 82L may be from about 50 nm to about 600 nm, and typically from about 100 nm to about 300 nm, although lesser and greater thicknesses are contemplated herein also. The first photoresist layer 82L may be formed by spin-on coating or equivalent methods.

Figure 2:
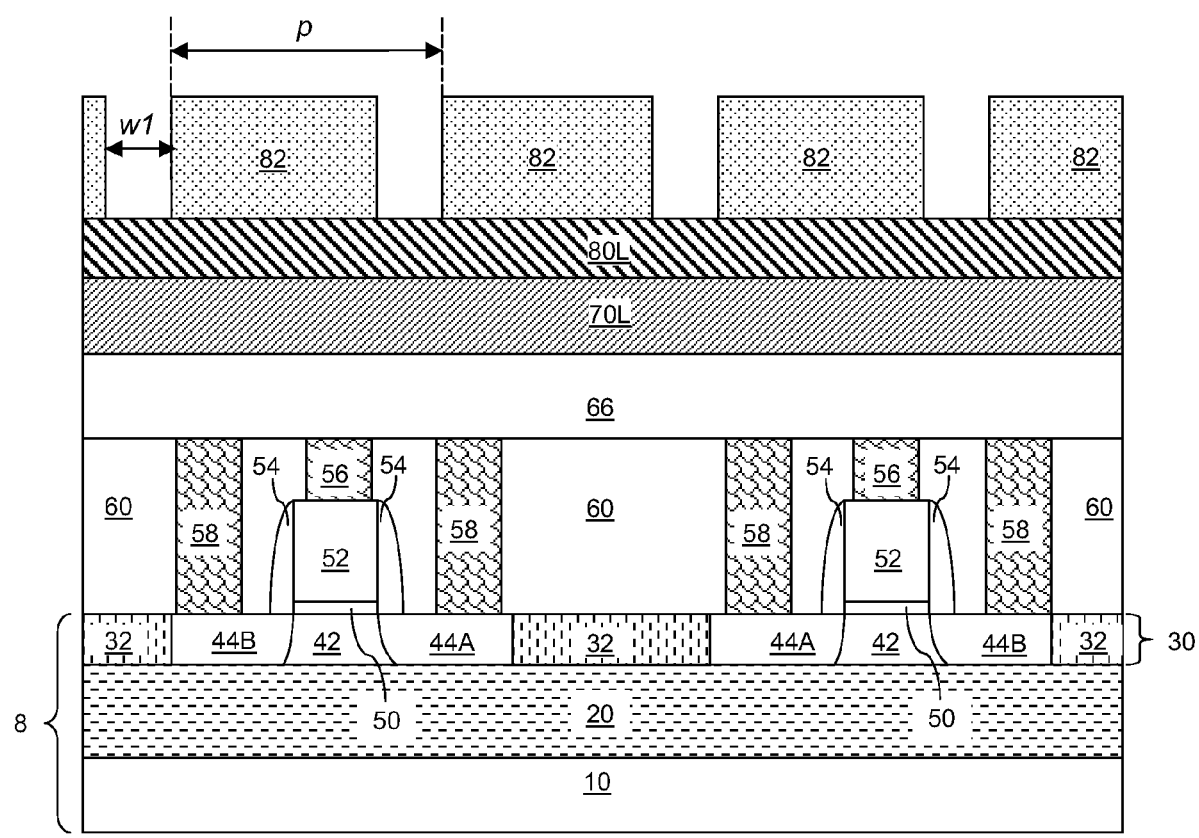

Referring to FIG. 2, the first photoresist layer 82L is patterned by lithographic means, i.e., exposure and development, to form first photoresist portions 82. The lithographic pattern may be a pattern of a periodic array, or may be an irregular pattern. Preferably, the lithographic pattern is a pattern of a regular periodic array. The lithographic pattern may contain an array of lines and spaces, or may contain a pattern of via holes in a matrix of the first photoresist portions 82. Each of the first photoresist portions 82 may be separated from one another as in the case of a lithographic pattern containing an array of lines and spaces, or may be adjoined among one another as in the case of a lithographic pattern containing an array of via holes. The lithographic pattern in the first photoresist portions 82 is herein referred to as a first pattern.

In case the first pattern comprises a periodic one dimensional array, the pitch of the first pattern is a lithographic dimension, which is herein referred to as a lithographic pitch p. If the first pattern is a pattern of lines and spaces, the lithographic pitch p is the lateral dimension of a unit pattern comprising one line and one space. If the first pattern is a pattern of via holes in a matrix of the first photoresist portions 82, which are adjoined amongst one another, the lithographic pitch is the lateral dimension of a unit pattern comprising at least one via hole. If the first pattern is a pattern of mandrels of the first photoresist portions 82, which are separated from one another, the lithographic pattern is the lateral dimension of a unit pattern comprising at least one mandrel. In addition to having periodicity in one direction at the lithographic pitch p, the first pattern may have another periodicity in another direction. For example, if the first pattern is a pattern of via holes or mandrels, a unit cell for the first pattern may have another periodicity along a direction that is different from the direction along which the first pattern has a periodicity with the lithographic pitch p. Optionally, overexposure or underexposure may be employed so that the width of each pattern between a neighboring pair of the first photoresist portions 82, which is herein referred to as a first width w1, is less than one half of the lithographic pitch p.

The lithographic pitch p is a lithographic dimension, i.e., a dimension that may be formed by lithographic means. The lithographic pitch p is the same as, or greater than, the minimum lithographic pitch that may be obtained by commercially available lithography tools. For example, if ArF lithography employing 193 nm wavelength light is used, the lithographic pitch p is the same as, or greater than about 90 nm, which is the lithographic minimum pitch.

Figure 3:
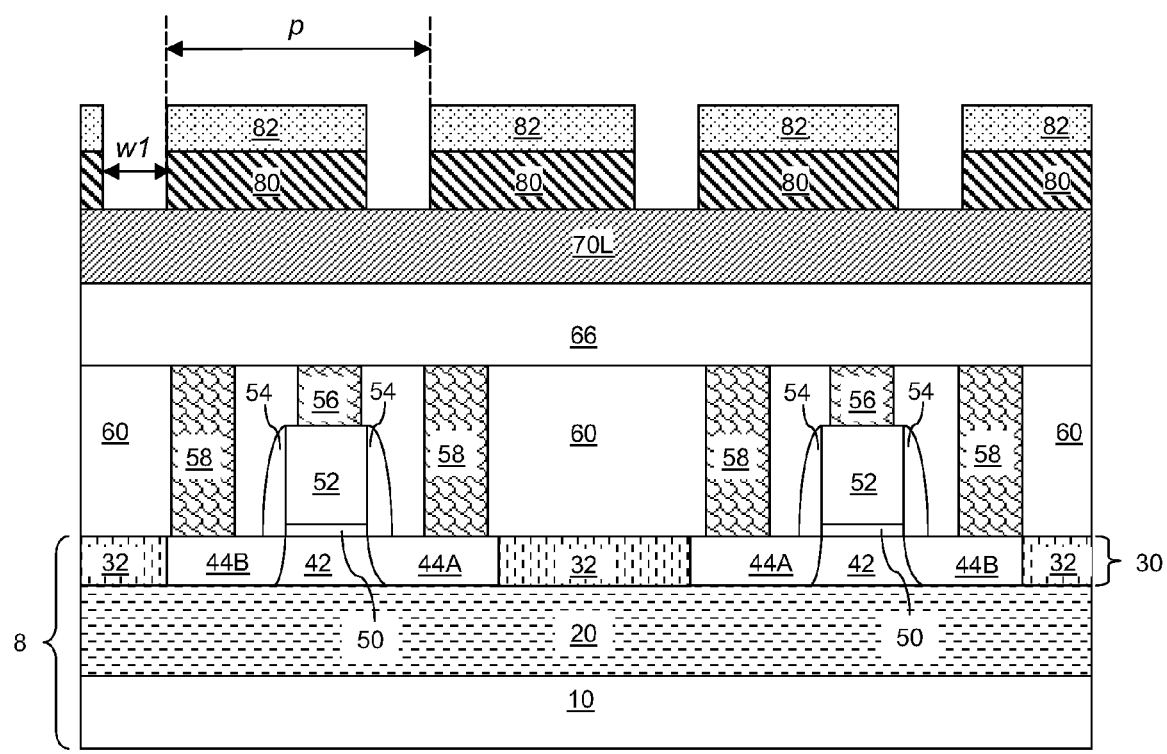

Referring to FIG. 3, the first pattern is transferred by an anisotropic etch into the ARC layer 80L to form ARC portions 80. The anisotropic etch may, or may not, be selective to the optically dense layer 70L. The ARC portions 80 collectively constitute a regular array having the lithographic pitch p in one direction. The width of each pattern between neighboring ARC portions 80 is substantially the same as the first width w1. Some or all of the first photoresist portions 82 may be removed during the formation of the array of the ARC portions 80. The ARC portions 80, and the first photoresist portions 82 is present, form the first pattern.

Figure 4:
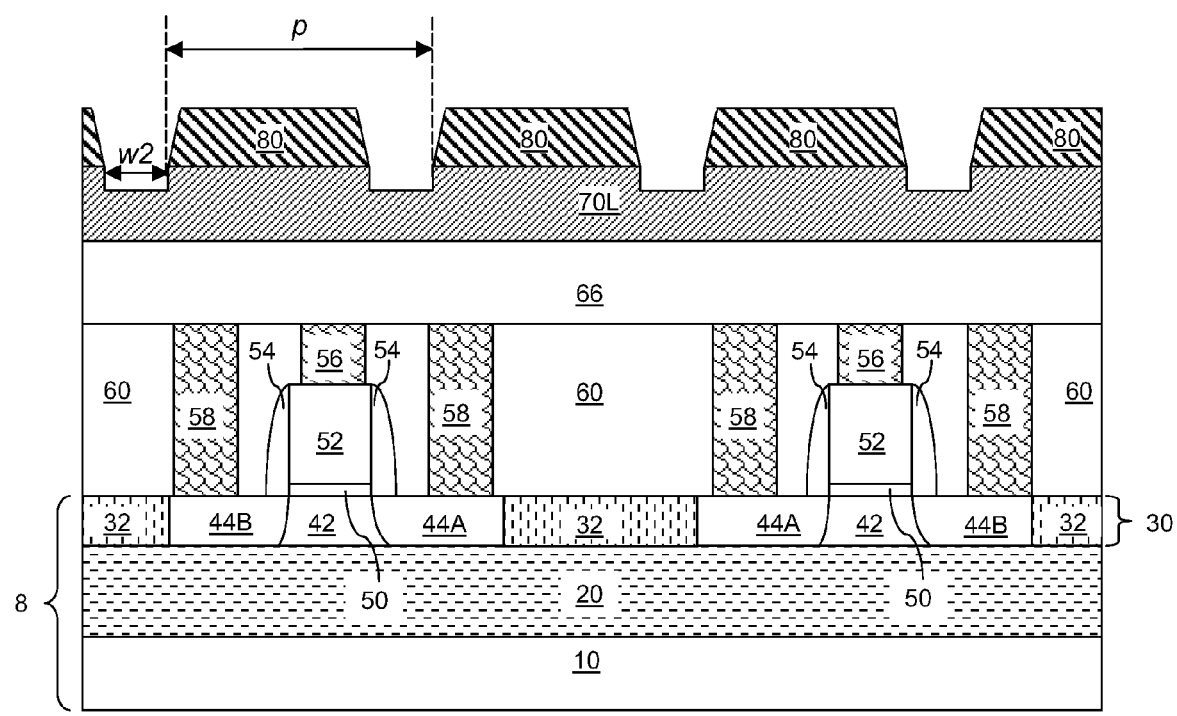

Referring to FIG. 4, the first pattern is transferred into the optically dense layer 70L by another isotropic etch. The first pattern is transferred into an upper portion of the optically dense layer 70L, but is not transferred into a lower portion of the optically dense layer 70L. In other words, the first pattern is transferred partially into the optically dense layer 70L, but the pattern transfer is stopped prior to the anisotropic etch reaches a bottom surface of the optically dense layer 70L.

In one embodiment, any remaining portions of the first photoresist portions 82 are removed during the anisotropic etch. In another embodiment, some portions of the first photoresist portions 82 remain after the anisotropic etch, and the remaining portions of the first photoresist portions 82 are removed in another etch after the anisotropic etch. Preferably, the etch employed to remove the remaining portions of the first photoresist portions 82 is selective to the ARC portions 80 and the optically dense layer 70L.

A periodic array of depressions is formed in the upper surfaces of the optically dense layer 70L according to the first pattern. The width of each depression is herein referred to as a second width w2. Since the location of each depression corresponds to the location of the space between a neighboring pair of first photoresist portions 82 in FIG. 2, the second width w2 is correlated to the first width w1. In case the sidewalls of the ARC portions 80 are vertical and the etch bias between the ARC portions 80 and the array of the depressions in the optically dense layer is zero, the second width w2 and the first width w1 are the same. Otherwise, the second width w2 may be greater than the first width w1 or less than the first width w1 depending on any taper in the sidewalls of the ARC portions 80 and the etch bias. The depth of each depression, as measured from non-depressed portions of the top surfaces of the optically dense layer 70L may be from about 5 nm to about 300 nm, and typically from about 10 nm to about 150 nm, although lesser and greater thicknesses are explicitly contemplated herein also. The depth of each depression is less than the thickness of the optically dense layer 70L prior to the transfer of the first pattern.

Figure 5:
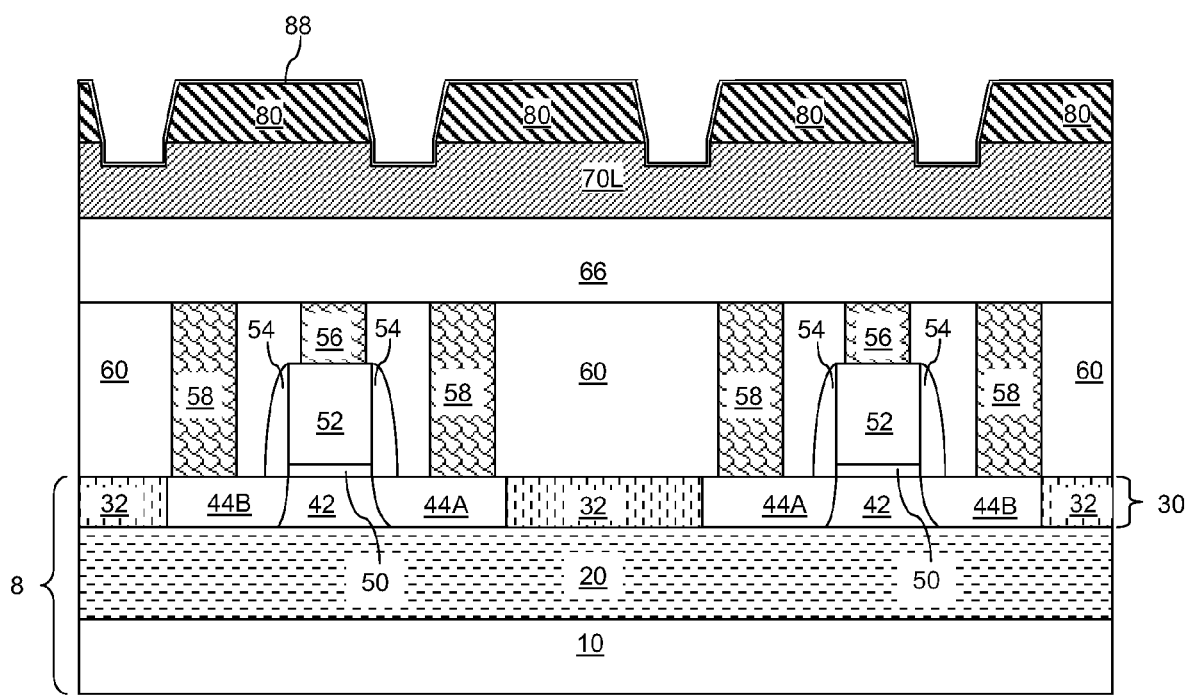

Referring to FIG. 5, an adhesion promoter layer 88 may optionally be applied over the exposed surfaces of the ARC portions 80 and the optically dense layer 70L. Typically, anti-reflective materials have hydrophobic surfaces on which a hydrophobic material may be applied with good wetting. However, plasma employed in the etching of the depression in the optically dense layer 70L typically renders the surfaces of the ARC portions 80 hydrophilic. By applying the adhesion promoter layer 88 on the top surfaces of the ARC portions 80 and the optically dense layer 70L, wetting of a second photoresist layer to be subsequently applied over the second exemplary lithographic structure is facilitated. An exemplary material for the adhesion promoter layer 88 is hexamethyldisilazane (HMDS). The thickness of the adhesion promoter layer 88 may be from about 1 nm to about 5 nm, although lesser and greater thicknesses are contemplated herein also. Application of the adhesion promoter layer 88 is optional, i.e., the adhesion promoter layer 88 may, or may not, be applied.

Figure 6:
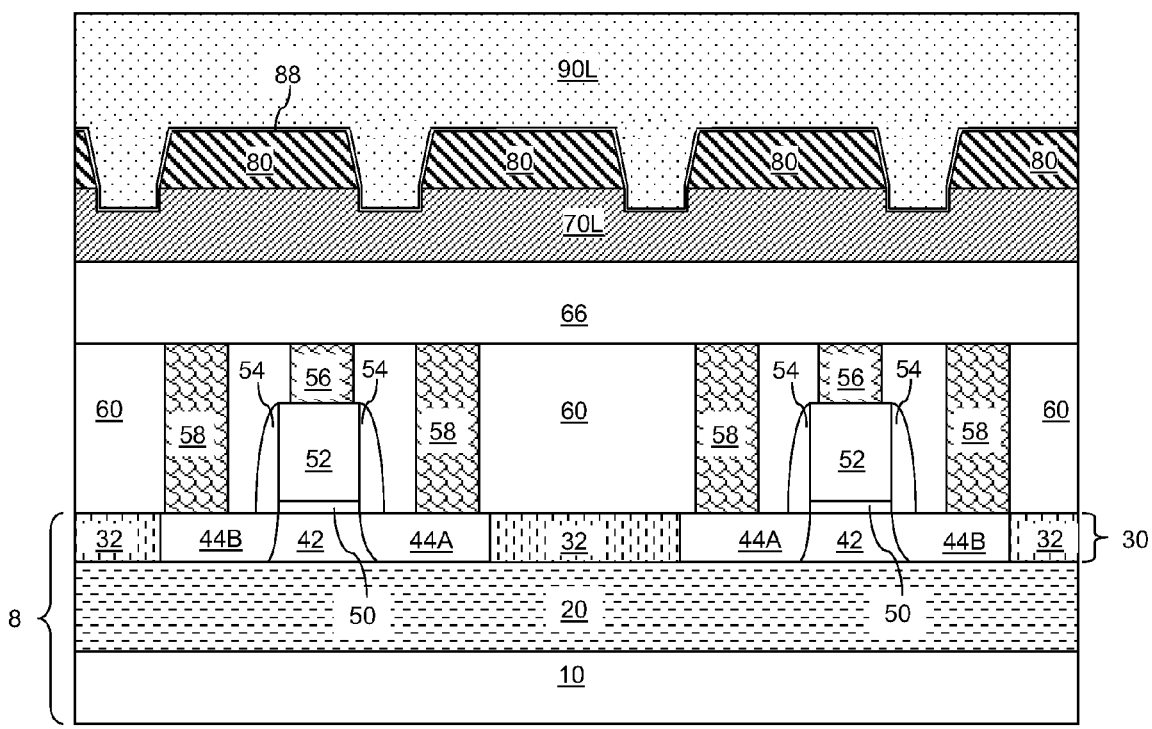

Referring to FIG. 6, a second photoresist layer 90L is applied over the adhesion promoter layer 88 and/or the ARC portions 80 and the optically dense layer 70L. The second photoresist layer 90L may comprise the same type of material as the first photoresist layer 82L in FIG. 1. Preferably, the second photoresist layer 90L comprises a self-planarizing material. The thickness of the second photoresist layer 90L, as measured above a top surface of the ARC portions 80, may be from about 50 nm to about 600 nm, and typically from about 100 nm to about 300 nm, although lesser and greater thicknesses are contemplated herein also. The second photoresist layer 90L may be formed by spin-on coating or equivalent methods.

Figure 7:
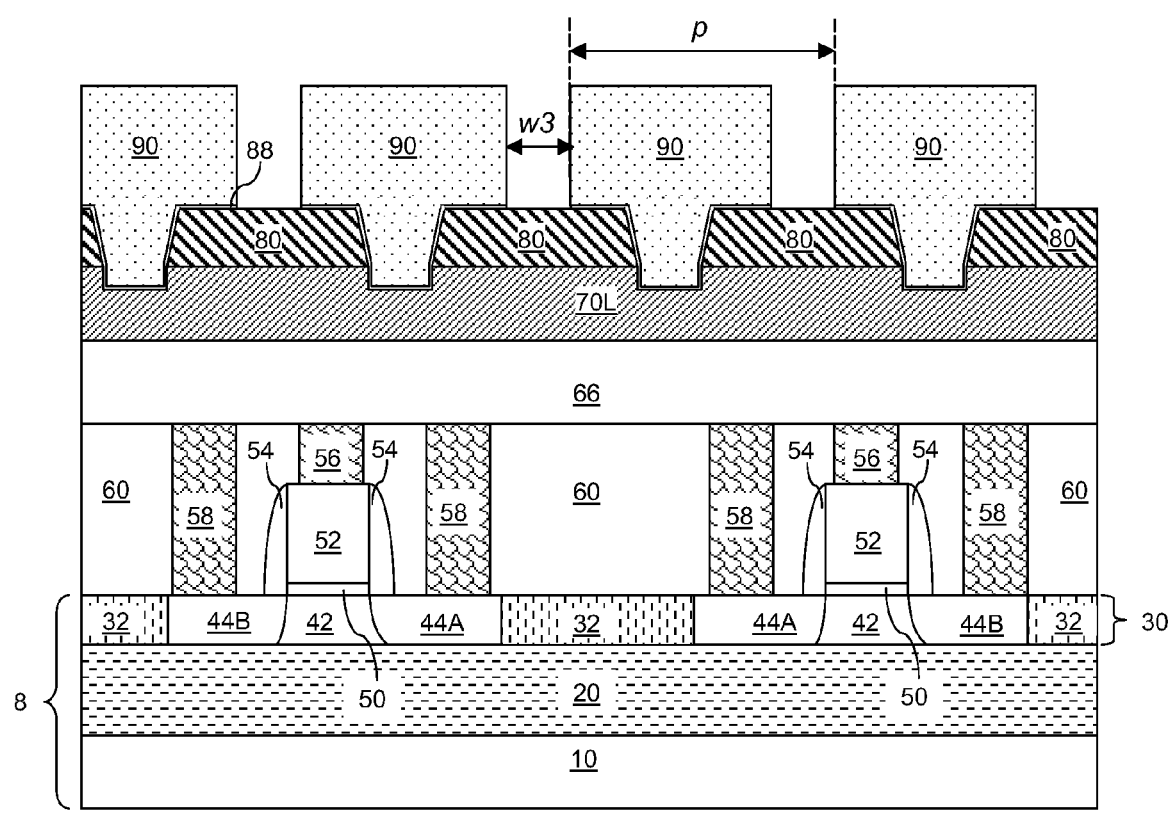

Referring to FIG. 7, the second photoresist layer 90L is patterned by lithographic means to form second photoresist portions 90. The lithographic pattern of the second photoresist portions 90, which is herein referred to as a second pattern, may be a pattern of a periodic array, or may be an irregular pattern. Preferably, the second pattern is a pattern of a regular periodic array. The second pattern may contain an array of lines and spaces, or may contain a pattern of via holes in a matrix of the first photoresist portions 90. Each of the second photoresist portions 90 may be separated from one another as in the case of a lithographic pattern containing an array of lines and spaces, or may be adjoined among one another as in the case of a lithographic pattern containing an array of via holes.

In case the second pattern comprises a periodic one dimensional array, the pitch of the second pattern may be the same as the pitch of the first pattern, i.e., the lithographic pitch p. Preferably, the first pattern and the second pattern comprise the same type of lithographic features. For example, if the first pattern is a pattern of lines and spaces, the second pattern is also a pattern of lines and spacers. If the first pattern is a pattern of via holes in a matrix of the first photoresist portions 82, the second pattern is also a pattern of via holes in a matrix of the second photoresist portions 90. If the first pattern is a pattern of mandrels of the first photoresist portions 82, the second pattern is a pattern of mandrels of the second photoresist portions 90. In addition to having periodicity in one direction at the lithographic pitch p, the second pattern may have another periodicity in another direction. Optionally, overexposure or underexposure may be employed so that the width of each pattern between a neighboring pair of second photoresist portions 90, which is herein referred to as a third width w3, is less than one half of the lithographic pitch p.

The third width w3 may, or may not, be the same as the first width w1. In case the third width w3 is the same as the first width w1, the second pattern and the first pattern may be congruent with each other and the second pattern may be shifted relative to the first pattern. In one embodiment, the shift along the direction of the periodicity of the first pattern may be one half of the lithographic pitch p, i.e., p/2. In another embodiment, the shift along the direction of the periodicity of the first pattern may be a fraction of the lithographic pitch p, i.e., p/n, in which n is an integer greater than 2.

In case the first pattern and the second pattern are congruent, each of the first pattern and the second pattern may comprise a periodic array of lines and spaces, a periodic array of via holes, or a periodic array of mandrels. The periodic array of via holes or the periodic array of mandrels may, or may not, be offset in a direction other than the direction of the periodicity with the lithographic pitch p. In case the offset is zero, the composite pattern of the first pattern and the second pattern may have a pitch that is one half of the lithographic pitch p. If the first pattern and the second pattern are separated by one half of the lithographic pitch p along the direction of the periodicity having the lithographic pitch and the first pattern and the second pattern are congruent, a unit cell of the composite pattern of the first pattern and the second pattern may have a periodicity at one half of the lithographic pitch p in one direction.

Figure 8:
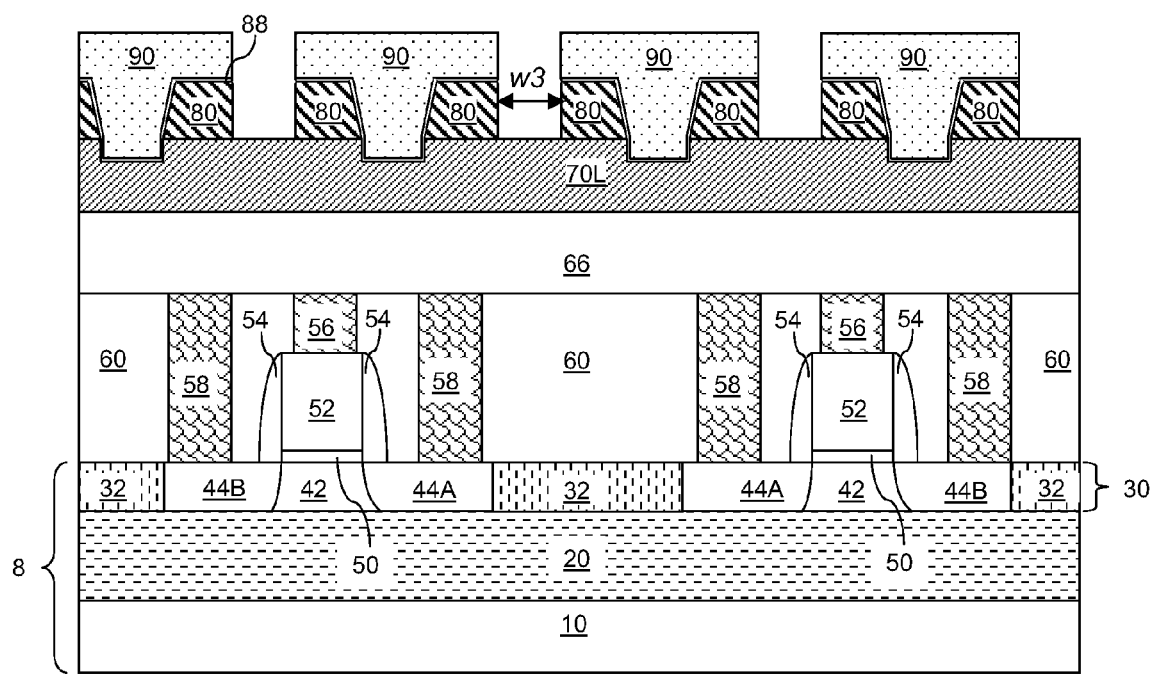

Referring to FIG. 8, the second pattern is transferred by an anisotropic etch into the ARC portions 80. Since the ARC portions 80 contains the first pattern, the transfer of the second pattern into the ARC portions 80 by the anisotropic etch forms a composite pattern, which is the composite pattern of the first pattern and the second pattern, in the ARC portions 80. The anisotropic etch may, or may not, be selective to the optically dense layer 70L. The ARC portions 80 collectively constitute a regular array containing the first pattern and the second pattern. The width between sidewalls of a neighboring pair of ARC portions 80 is substantially the same as the third width w3. Some or all of the second photoresist portions 90 may be removed during the transfer of the second pattern into the ARC portions 80. A top surface of the optically dark layer 70L is exposed between each neighboring pair of the ARC portions 80. The second photoresist portions 90 may be separated from one another, or may be adjoined to each other depending on the type of the first pattern and the second pattern.

Figure 9:
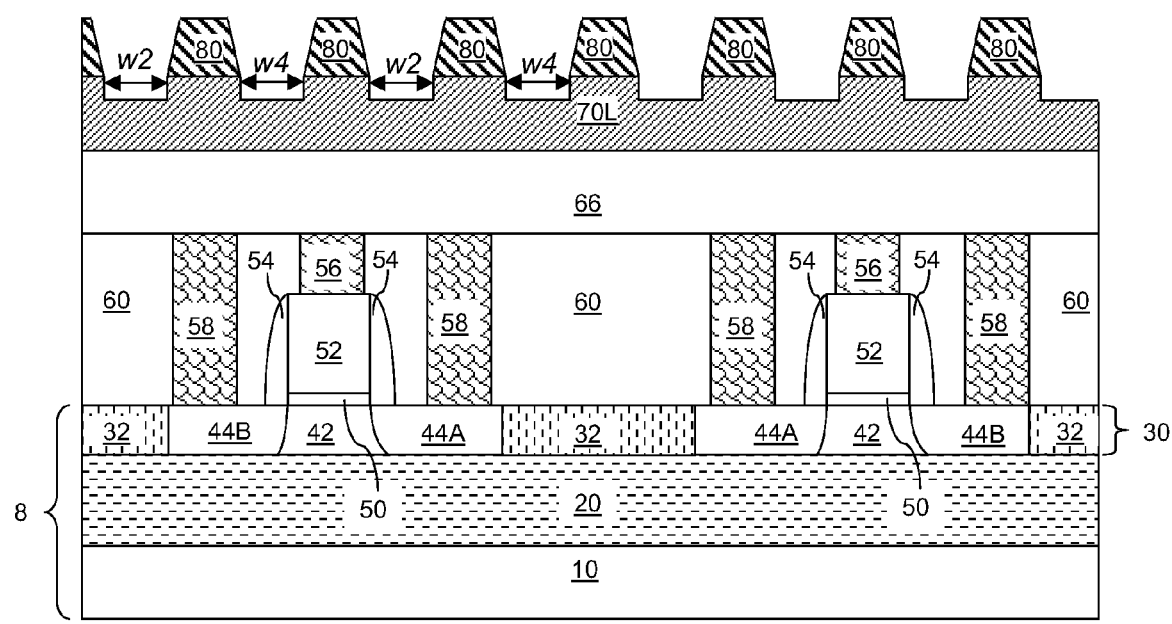

Referring to FIG. 9, the second pattern is transferred into the optically dense layer 70L by another isotropic etch. The second pattern is transferred into an upper portion of the optically dense layer 70L, but is not transferred into a lower portion of the optically dense layer 70L in the same manner as the transfer of the first pattern into the upper portion of the optically dense layer 70L. In other words, the second pattern is transferred partially into the optically dense layer 70L, but the pattern transfer is stopped prior to the anisotropic etch reaches the bottom surface of the optically dense layer 70L.

In one embodiment, any remaining portions of the second photoresist portions 90 are removed during the anisotropic etch. In another embodiment, some portions of the second photoresist portions 90 remain after the anisotropic etch, and the remaining portions of the second photoresist portions 90 are removed in another etch after the anisotropic etch. Preferably, the etch employed to remove the remaining portions of the second photoresist portions 90 is selective to the ARC portions 80 and the optically dense layer 70L. Any remaining portions of the adhesion promoter layer 88 are also removed.

Another periodic array of depressions is formed in the upper surfaces of the optically dense layer 70L according to the second pattern. The width of each depression according to the second pattern is herein referred to as a fourth width w4. Since the location of each depression according to the second pattern corresponds to the location of the space between a neighboring pair of second photoresist portions 90 in FIG. 7, the fourth width w4 is correlated to the third width w3. In case the sidewalls of the ARC portions 80 are vertical and the etch bias between the ARC portions 80 and the array of the depressions according to the second pattern in the optically dense layer is zero, the fourth width w4 and the third width w3 are the same. Otherwise, the fourth width w4 may be greater than the third width w3 or less than the third width w3 depending on any taper in the sidewalls of the ARC portions 80 and the etch bias. The depth of each depression according to the second pattern, as measured from non-depressed portions of the top surfaces of the optically dense layer 70L may be from about 5 nm to about 300 nm, and typically from about 10 nm to about 150 nm, although lesser and greater thicknesses are explicitly contemplated herein also. The depth of each depression is less than the thickness of the optically dense layer 70L prior to the transfer of the first pattern.

The array of the ARC portions 80 constitutes the composite pattern of the first pattern and the second pattern. In a variation of the exemplary lithographic structure, at least another adhesion promoter layer and at least another photoresist layer may be applied and patterned, repeatedly if applicable, to form at least another pattern that is transferred into the ARC portions 80 so that at the array of the ARC portions 80 has a composite pattern including at least another pattern in addition to the first and the second pattern.

Figure 10:
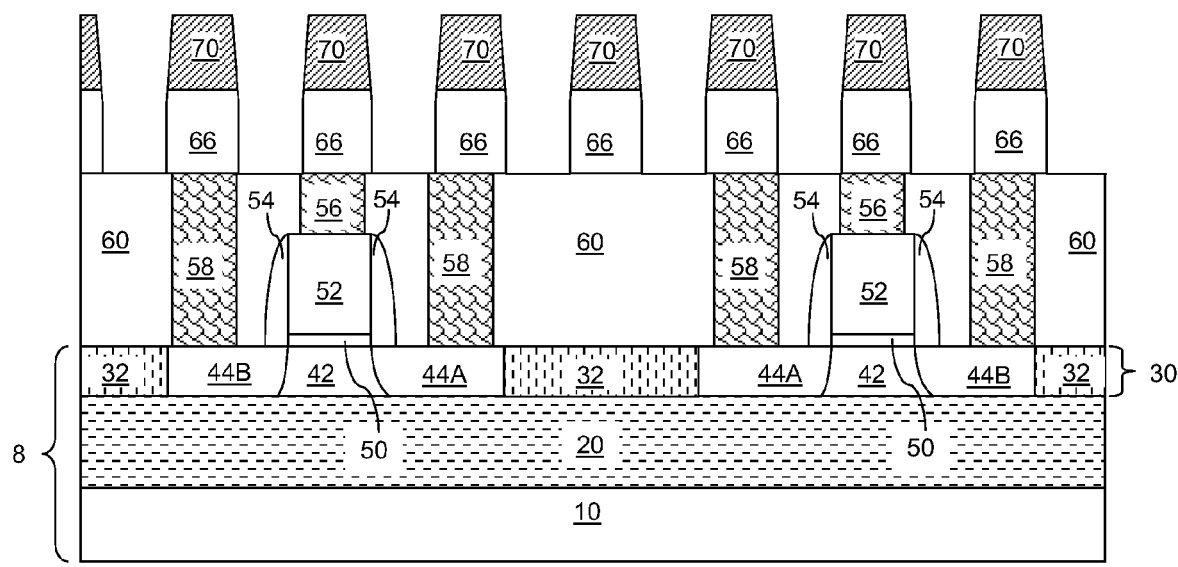

Referring to FIG. 10, the composite pattern in the array of the ARC portions 80 is transferred into the optically dark layer 70 and the underlying layer 66 by at least one anisotropic etch. Preferably, an etch chemistry selective to the ARC portions 80 is employed during the transfer of the composite pattern in the array of the ARC portions 80 into the optically dark layer 70. The composite pattern in the optically dark layer 70 is then transferred into the underlying layer 66. The array of the ARC portions 80 may, or may not, be completely consumed during the transfer of the composite pattern into the underlying layer 66. In case the array of the ARC portions 80 is completely consumed during the pattern transfer into the underlying layer 66, an etch chemistry that etches the underlying layer 66 selective to the optically dark layer 70 is employed. The etch chemistry employed to etch the underlying layer 66 depends on the composition of the underlying layer 66.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a patterned structure comprising:
    forming a stack on a substrate, said stack including, from bottom to top, an underlying layer, an optically dense layer comprising a hydrocarbon-based polymer, an anti-reflective coating (ARC) layer, and a first photoresist;
    lithographically patterning said first photoresist with a first pattern and transferring said first pattern into said ARC layer and an upper portion of said optically dense layer, but not into a lower portion of said optically dense layer, by a first etch;
    applying a second photoresist on said optically dense layer and said ARC layer;
    lithographically patterning said second photoresist with a second pattern and transferring said second pattern into said ARC layer by a second etch; and
    transferring a composite pattern of said first pattern and said second pattern through said optically dense layer and into said underlying layer, wherein said first pattern is a pattern of a periodic array having a lithographic pitch, wherein said second pattern is a pattern of another periodic array having said lithographic pitch, wherein said first pattern and said second pattern are congruent and are offset relative to each other by one half of said lithographic pitch.

2. The method of claim 1, wherein said optically dense layer is formed directly on said underlying layer.

3. The method of claim 1, wherein said composite pattern has a pitch that is one half of said lithographic pitch.

4. The method of claim 3, wherein said pitch of said composite pattern is a sublithographic pitch.

5. The method of claim 1, wherein said composite pattern is a pattern of lines and spaces.

6. The method of claim 1, wherein said composite pattern is a pattern of via holes.

7. The method of claim 1, wherein said first photoresist is removed prior to applying said second photoresist.

8. The method of claim 7, further comprising applying an adhesion promoter layer directly on said ARC layer containing said first pattern, wherein said second photoresist is applied directly on said adhesion promoter layer.

9. The method of claim 1, further comprising transferring said first pattern partially into said optically dense layer by said first etch, wherein said first photoresist is completely consumed by said first etch.

10. The method of claim 9, further comprising transferring said second pattern partially into said optically dense layer by said second etch, wherein said second photoresist is completely consumed by said second etch.

11. The method of claim 1, wherein said ARC layer contains said composite pattern after said second etch, and wherein sidewalls of said ARC layer are tapered.

12. The method of claim 1, wherein said ARC layer comprises one of silicon and an refractory metal at an atomic concentration from about 1% to about 50%.

13. The method of claim 1, wherein said optically dense layer has an optical density greater than log 10, said optical density is a logarithm of a ratio of an intensity of an incident ray to an intensity of a transmitted ray.

14. The method of claim 1, wherein said ARC layer comprises silicon at an atomic concentration from about 1% to about 50%.

15. The method of claim 1, wherein said ARC layer comprises a refractory metal at an atomic concentration from about 1% to about 50%.

16. The method of claim 1, wherein said ARC layer has a different composition than said optically dense layer.

* * * * *